(12) United States Patent
Kwon

(10) Patent No.: US 8,421,523 B2
(45) Date of Patent: Apr. 16, 2013

(54) VOLTAGE SUPPLY CIRCUIT AND INTEGRATED CIRCUIT INCLUDING THE SAME

(75) Inventor: Jae Kwan Kwon, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/309,792

(22) Filed: Dec. 2, 2011

(65) Prior Publication Data
US 2012/0139621 A1 Jun. 7, 2012

(30) Foreign Application Priority Data
Dec. 3, 2010 (KR) .......................... 10-2010-0122908

(51) Int. Cl.
*G05F 1/10* (2006.01)
(52) U.S. Cl.
USPC .......................................... 327/536

(58) Field of Classification Search ................... None
See application file for complete search history.

(56) References Cited

U.S. PATENT DOCUMENTS
6,901,009 B2 * 5/2005 Natori .................. 365/185.18

FOREIGN PATENT DOCUMENTS
| JP | 2005117773 A | 4/2005 |
| JP | 2010004717 A | 1/2010 |
| KR | 1020050089101 A | 9/2005 |
| KR | 1020080108023 A | 12/2008 |

* cited by examiner

*Primary Examiner* — Lincoln Donovan
*Assistant Examiner* — Sibin Chen
(74) *Attorney, Agent, or Firm* — William Park & Associates Ltd.

(57) ABSTRACT

A voltage supply circuit includes a pump voltage generator for generating an input voltage by changing a power source voltage to a desired level and changing a level of the input voltage according to a rising time of an operating voltage.

17 Claims, 4 Drawing Sheets

VOLTAGE SUPPLY CIRCUIT AND INTEGRATED CIRCUIT INCLUDING THE SAME

CROSS-REFERENCE TO RELATED APPLICATION

This application claims priority to Korean patent application number 10-2010-0122908 filed on Dec. 3, 2010, in the Korean Intellectual Property Office, the disclosure of which is incorporated by reference herein in its entirety.

BACKGROUND

1. Field of the Invention

Embodiments of the invention relate generally to a voltage supply circuit and, and more particularly to an integrated circuit including the same.

2. Description of the Related Art

An integrated circuit is a functional and complex electronic element or system having an ultra-small structure in which lots of electronic circuit elements are coupled on or to one substrate. The integrated circuit or device includes a voltage supply circuit for supplying a power source for an operation.

Low voltage is typically supplied to an ultra-small integrated circuit. The integrated circuit, however, frequently requires high voltage for an internal operation. Accordingly, a voltage supply circuit used in the integrated circuit includes a pump circuit for generating high voltage that may be achieved by pumping a low input power source voltage. The time that it takes an integrated circuit to perform operations may vary according to how quickly the pump circuit raises the low input power source voltage to a target voltage.

For example, when data is programmed in an integrated circuit, such as a semiconductor memory device, the total time taken to perform a program operation may be reduced if there is a reduction in the time to generate and supply a high voltage needed for the program operation.

In order to control the operating time, a rising time of voltage outputted from the pump circuit may need to be controlled.

The pump circuit is designed according to a load of an output node. Accordingly, when a voltage supply circuit included in the integrated circuit is designed, the rising time of the output voltage may be set through accurate modeling of the voltage supply circuit. If modeling is not accurate, the integrated circuit may not operate normally because the rising time of the output voltage is not set as desired, thereby requiring correction of the inaccurate modeling (that is, a revision). The correction process is a complicated and time consuming task.

BRIEF SUMMARY

An embodiment provides a voltage supply circuit and an integrated circuit including the same, in which the time that the output voltage of the voltage supply circuit takes to rise up to a target voltage can be flexibly changed according to a surrounding environment.

A voltage supply circuit according to an embodiment of this disclosure includes a pump voltage generator for generating an input voltage by changing a power source voltage to a desired level and changing a level of the input voltage according to a rising time of an operating voltage.

A voltage supply circuit according to another embodiment of this disclosure includes a pump voltage generator for generating a first voltage in response to voltage control information; a pump group for pumping voltage by using the first voltage and first and second clocks in response to a pump enable signal and supplying a pumped voltage to a driving circuit in response to an output control signal; a clock generator for generating the first and second clocks swinging between the first voltage and a ground voltage; a regulator for controlling the operation of the clock generator in order to regularly maintain an output voltage of the pump group; and a rising time controller for calculating a rising time of the pumped voltage by using the pump enable signal and the output control signal, and outputting the voltage control information according to the calculated rising time.

An integrated circuit according to yet another embodiment of this disclosure includes a voltage supply circuit for supplying an operating voltage to an internal circuit and a control circuit for controlling operations of the voltage supply circuit and the internal circuit, wherein the voltage supply circuit includes a pump voltage generator for generating a first voltage in response to voltage control information; a pump group for pumping voltage by using the first voltage and first and second clocks in response to a pump enable signal generated from the control circuit and supplying the pumped voltage as the operating voltage of the internal circuit in response to an output control signal generated from the control circuit; a clock generator for generating the first and second clocks swinging between the first voltage and a ground voltage in response to a system clock signal; a regulator for controlling an operation of the clock generator in order to regularly maintain an output voltage of the pump group; and a rising time controller for calculating a rising time of the pumped voltage by using the pump enable signal and the output control signal and outputting voltage control information according to the calculated rising time.

An integrated circuit according yet another embodiment of this disclosure includes a pump group configured to generate for generating an operating voltage by pumping an input voltage in response to clocks swinging between the input voltage and a ground voltage; a voltage transfer circuit for supplying the operating voltage of the pump group to an internal circuit in response to a voltage output signal; and an input voltage generator for controlling a level of the input voltage according to a rising time of the operating voltage determined by a pump enable signal, the voltage output signal, and an input clock signal.

DESCRIPTION OF EMBODIMENT

Hereinafter, some example embodiments of the present disclosure will be described in detail with reference to the accompanying drawings. The figures are provided to allow those of ordinary skill in the art an understanding of the scope of the embodiments of the disclosure.

Figure 1:
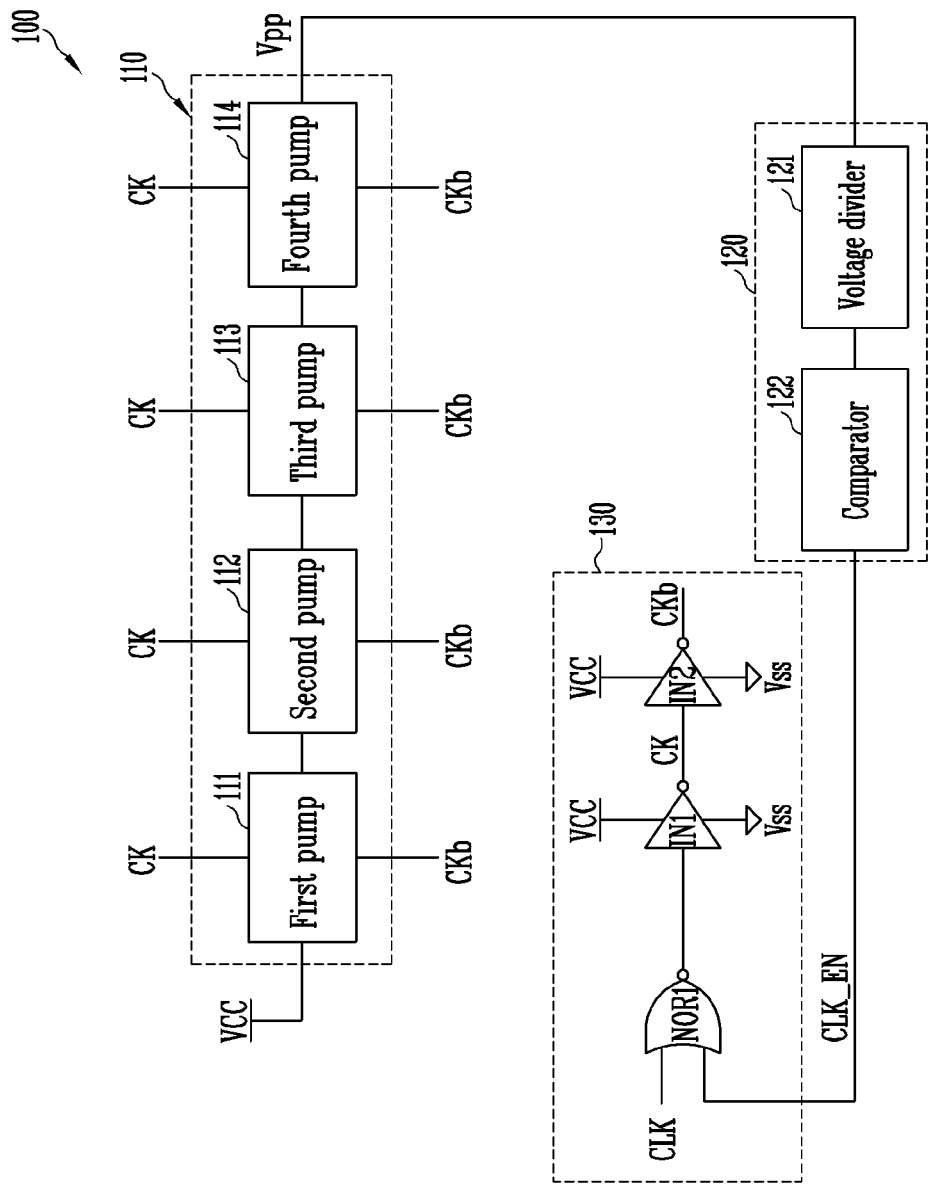
FIG. 1 is a diagram illustrating a voltage supply device.

FIG. 1 is a diagram illustrating a voltage supply device.

The voltage supply device 100 of FIG. 1 is used in an integrated circuit. The voltage supply device 100 includes a plurality of pump groups 110, a regulator 120, and a clock generator 130.

The plurality of pump groups 110 includes first to fourth pumps 111 to 114 coupled in series. The number of pumps may be increased or decreased according to a level of an output voltage Vpp.

The first pump 111 uses a power source voltage VCC as an input voltage and pumps the power source voltage VCC in response to first and second clocks CK and CKb.

Each of the second to fourth pumps 112 to 114 uses voltage, outputted from a previous stage, as an input voltage and performs a voltage pumping operation in response to the first and the second clocks CK and CKb.

The regulator 120 generates a clock enable signal CLK_EN for regularly maintaining the output voltage Vpp of the pump group 110.

The regulator 120 includes a voltage divider 121 and a comparator 122.

The voltage divider 121 divides voltage received from the output voltage Vpp of the pump group 110 and outputs a division voltage to the comparator 122. The comparator 122 makes a comparison between a reference voltage (not shown) and the division voltage received from the voltage divider 121, and the comparator 122 generates the clock enable signal CLK_EN according to a result of the comparison between the division voltage and the reference voltage.

If the division voltage is higher than the reference voltage, the comparator 122 may generate a high level clock enable signal CLK_EN. If the division voltage is lower than the reference voltage, the comparator 122 may generate a low level clock enable signal CLK_EN.

The clock generator 130 generates the first and the second clocks CK and CKb in response to the clock enable signal CLK_EN.

To this end, the clock generator 130 includes a first NOR gate NOR1 and first and second inverters IN1 and IN2.

The first NOR gate NOR1 receives the clock signal CLK and the clock enable signal CLK_EN.

If one of the clock signal CLK and the clock enable signal CLK_EN is a high level signal, the first NOR gate NOR1 outputs a signal of a low level. If the clock signal CLK and the clock enable signal CLK_EN are a low level signal, the first NOR gate NOR1 inverts the CLK signal and outputs an inverted signal. That is, when a high clock enable signal CLK_EN is received, the first NOR gate NOR1 outputs a low signal level irrespective of the clock signal CLK. However, when a low clock enable signal CLK_EN is received, the first NOR gate NOR1 outputs an inverted clock signal CLK.

The first and the second inverters IN1 and IN2 pull up or pull down an input signal to the power source voltage VCC or the ground voltage VSS.

The first inverter IN1 outputs the first clock CK, and the second inverter IN2 outputs the second clock CKb. The first and the second clocks CK and CKb have opposite phases and swing between the power source voltage VCC and the ground voltage VSS.

The power source voltage VCC, which is inputted to the first pump 111, influences a rising time RT of the output voltage Vpp (that is, one of elements indicating a driving ability of the voltage supply device 100). The power source voltage VCC may also influence a swing width of the first and the second clocks CK and CKb.

The rising time RT becomes fast according to an increase of the driving ability, but becomes slow according to a decrease of the driving ability.

The power source voltage VCC inputted to the first pump 111 is also inputted to the first and the second inverters IN1 and IN2. In general, the power source voltage VCC is an external fixed voltage. The driving ability of the voltage supply device 100 of FIG. 1 may be determined by the fixed power source voltage VCC. If the external voltage is fixed, it may be difficult to optimize the rising time RT of the output voltage Vpp.

In an embodiment of this disclosure, however, a voltage supply circuit 200 for supplying the output voltage Vpp to an integrated circuit, such as a semiconductor memory device, may control the rising time RT of the output voltage Vpp.

Figure 2A:
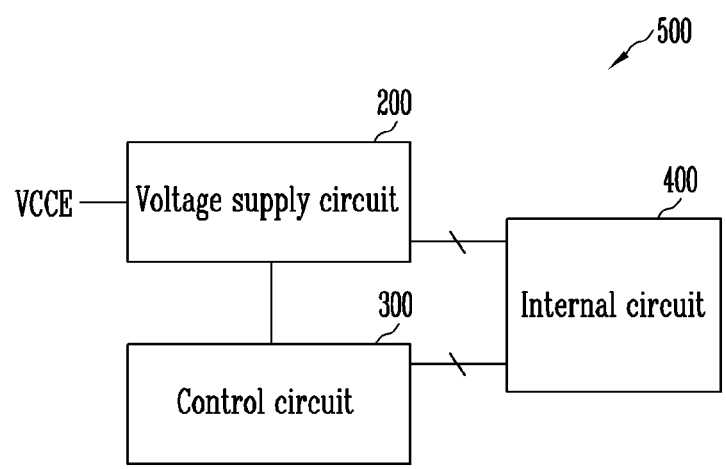
FIG. 2A is a block diagram illustrating an integrated circuit.

FIG. 2A is a block diagram illustrating an integrated circuit.

Referring to FIG. 2A, the integrated circuit 500 includes a voltage supply circuit 200, a control circuit 300, and an internal circuit 400.

The internal circuit 400 may include one or more circuits according to a type of the integrated circuit 500. A semiconductor memory device, such as the integrated circuit 500, may include, for example, a memory cell array and a page buffer.

The control circuit 300 controls the operations of the internal circuit 400 and the voltage supply circuit 200.

The voltage supply circuit 200 generates an operating voltage necessary for the internal circuit 400 to operate properly. The voltage supply circuit 200 may use a clock signal, a power source voltage VCCE, and additional signals inputted from the control circuit 300 in generating the operating voltage.

The voltage supply circuit 200 may control the time that an output voltage takes to rise up to a target voltage.

Figure 2B:
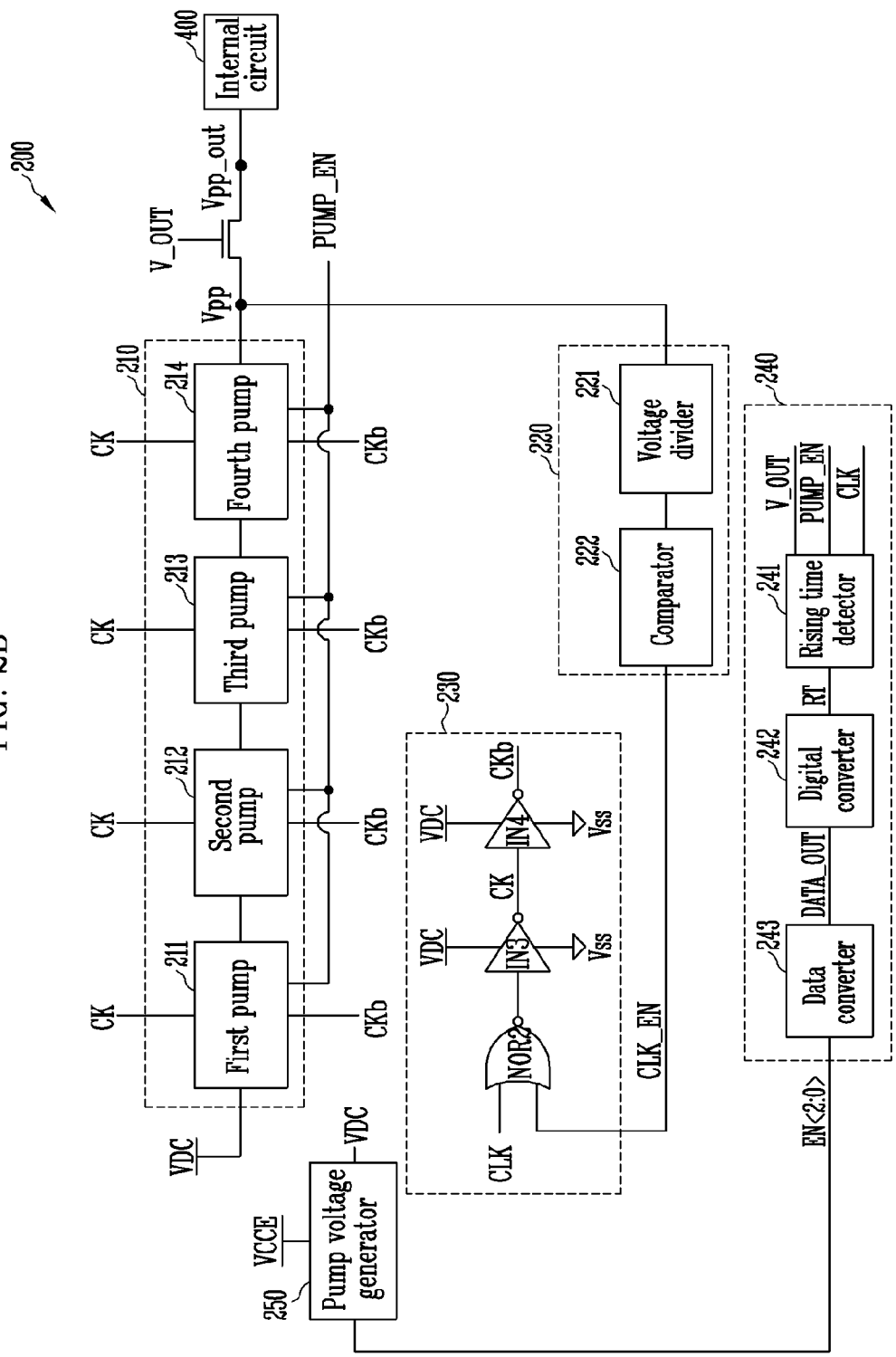
FIG. 2B shows a voltage supply circuit according to an embodiment of this disclosure.

FIG. 2B shows the voltage supply circuit 200 according to an embodiment of this disclosure.

The voltage supply circuit 200 is included in the integrated circuit 500 of FIG. 2A.

The voltage supply circuit 200 of FIG. 2B may generate an output voltage Vpp by using the power source voltage VCCE and a clock signal CLK. The clock signal CLK may be supplied by the control circuit 300, the internal circuit 400, or an external circuit.

In some embodiments, the voltage supply circuit 200 may include a clock generation circuit (not shown) for generating the clock signal CLK which may be a system clock signal.

Referring to FIG. 2B, the voltage supply circuit 200 includes a pump group 210, a regulator 220, a clock generator 230, and an input voltage generator (240 and 250). The input voltage generator includes a rising time controller 240 and the pump voltage generator 250. The voltage supply circuit 200 further includes a transistor for outputting the output voltage Vpp or operating voltage to an internal circuit 400 in response to a voltage output signal V_OUT. The internal circuit 400 may operate normally only when the rising time RT of an input voltage Vpp_out is optimized for the internal circuit 400.

The transistor transfers the output voltage Vpp to the internal circuit 400 in response to the voltage output signal V_OUT. The voltage output signal V_OUT may be generated from the control circuit 300 (see FIG. 2A).

When an operating voltage is required for the internal circuit 400, the control circuit 300 generates a pump enable signal PUMP_EN so that the voltage supply circuit 200 generates the output voltage Vpp. The control circuit 300 also generates the voltage output signal V_OUT in order to control timing when the output voltage Vpp is actually inputted to the internal circuit 400.

The pump group 210 includes first to fourth pumps 211 to 214. In some embodiment, the pump group 210 may include a larger number of pumps according to a level of the output voltage Vpp to be outputted.

The first to fourth pumps 211 to 214 are coupled in series and are operated in response to the pump enable signal PUMP_EN. The first pump 211 placed at a first stage receives a pump voltage VDC and pumps the pump voltage VDC in response to first and the second clocks CK and CKb. Voltage outputted from the first pump 211 is inputted to the second pump 212.

Each of the second to the fourth pumps 212 to 214 pumps voltage, received from a previous stage, in response to the first and the second clocks CK and CKb. The fourth pump 214 outputs the output voltage Vpp.

The regulator 220 regularly maintains the output voltage Vpp of the pump group 210. The regulator 220 includes a voltage divider 221 and a comparator 222. The voltage divider 221 divides the output voltage Vpp and outputs a divided voltage. The comparator 222 makes a comparison between the divided voltage and a reference voltage and the comparator 222 outputs a clock enable signal CLK_EN according to a result of the comparison.

The clock generator 230 may receive the clock signal CLK. The clock generator 230 generates the first and the second clocks CK and CKb by using the supplied clock signal CLK response to the clock enable signal CLK_EN. The clock generator 230 includes a second NOR gate NOR2 and third and fourth inverters IN3 and IN4.

The second NOR gate NOR2 receives the clock enable signal CLK_EN and the clock signal CLK. When the clock enable signal CLK_EN of a high level is received, the second NOR gate NOR2 outputs a signal of a low level irrespective of the clock signal CLK. However, when a clock enable signal CLK_EN of a low level is received, the second NOR gate NOR2 inverts the clock signal CLK and outputs an inverted signal.

The third inverter IN3 generates the first clock CK by inverting the output of the second NOR gate NOR2. The fourth inverter IN4 outputs the second clock CKb inverted from the first clock CK of the third inverter IN3.

The third and the fourth inverters IN3 and IN4 use the pump voltage VDC and a ground voltage VSS as driving voltages. Accordingly, the first and the second clocks CK and CKb outputted from the third and the fourth inverters IN3 and IN4 swing between the pump voltage VDC and the ground voltage VSS.

The rising time controller 240 outputs voltage control information as signals EN<2:0> comprising 3 bits, for controlling the rising time RT of the output voltage Vpp. The voltage control information may comprise a first voltage control bit, a second voltage control bit and a third voltage control bit. To this end, the rising time controller 240 includes a rising time detector 241, a digital converter 242, and a data converter 243.

The rising time detector 241 detects the rising time RT of the output voltage Vpp, required by the integrated circuit 500.

The rising time RT of the output voltage Vpp may be controlled according to the operation of the internal circuit 400 of the integrated circuit 500. Factors for setting the rising time RT include the voltage output signal V_OUT and a time at which the pump enable signal PUMP_EN is outputted. As previously explained, the output signal V_OUT may control the output voltage Vpp so that that output voltage Vpp is supplied to the internal circuit 400. Also, the pump enable signal PUMP_EN may enable the operation of the pump group 210.

The rising time detector 241 receives the voltage output signal V_OUT, the pump enable signal PUMP_EN, and the clock signal CLK. The rising time detector 241 detects the time when the pump enable signal PUMP_EN and the voltage output signal V_OUT signals are received in response to the clock signal CLK, and the rising time detector 241 outputs a detected signal as the rising time RT of the output voltage Vpp.

For example, if the integrated circuit 500 is a semiconductor memory device, the output voltage Vpp may be supplied to a word line of the semiconductor memory device. Here, when the control circuit 300 outputs the pump enable signal PUMP_EN, the voltage supply circuit 200 starts operating.

In order to supply the output voltage Vpp to the word line, the voltage output signal V_OUT is outputted. The output voltage Vpp may be raised up to a target voltage at a time at which the voltage output signal V_OUT is outputted. Accordingly, the rising time RT is measured by using the pump enable signal PUMP_EN and the voltage output signal V_OUT. The measured rising time RT is then transferred to the digital converter 242.

If the voltage supply circuit 200 is used in a semiconductor memory device, the voltage output signal V_OUT may become a pass signal for transferring voltage, supplied to global word lines, to a selected word line.

The digital converter 242 receives the rising time RT and converts the rising time RT to digital information DATA_OUT. The digital converter 242 stores data, related to the digital information according to the rising time RT, in the form of a table. The digital information DATA_OUT is sent to the data converter 243.

The data converter 243 outputs the voltage control signals EN<2:0> by using the digital information DATA_OUT. The data converter 243 also stores information about the voltage control signals according to the digital information DATA_OUT, in the form of a table.

The pump voltage generator 250 changes a power source voltage VCCE according to a level of the pump voltage VDC in response to the voltage control signals EN<2:0>, and the pump voltage generator 250 outputs a changed voltage.

The pump voltage VDC remains constant in response to the voltage control signals EN<2:0>. Accordingly, the rising time RT of the output voltage Vpp is controlled by the pump group 210, where the pump group 210 performs a pumping operation using the pump voltage VDC and the first and the second clocks CK and CKb. The level of the pump voltage VDC provides the rising time RT of the output voltage Vpp optimized for the integrated circuit 500. The pump voltage generator 250 for outputting the pump voltage VDC may also include a voltage down-converter circuit.

Figure 3:
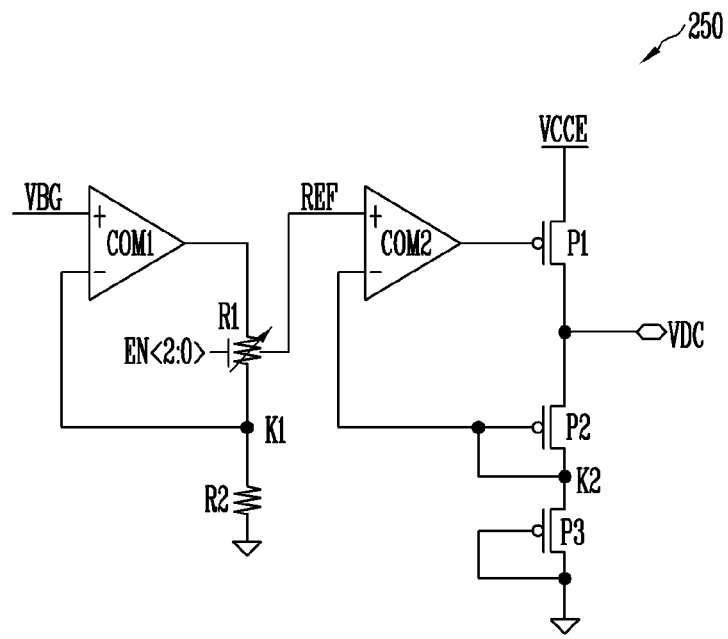
FIG. 3 shows a pump voltage generator of FIG. 2B.

FIG. 3 shows the pump voltage generator 250 of FIG. 2B. Referring to FIG. 3, the pump voltage generator 250 includes first and second comparators COM1 and COM2, first and second resistors R1 and R2, and first, second and third PMOS transistors P1, P2 and P3.

A bandgap voltage VBG is inputted to a non-inverting terminal (+) of the first comparator COM1. The bandgap voltage VBG may correspond to the reference voltage that is regularly maintained. An inverting terminal (−) of the first comparator COM1 is coupled to a node K1. The node K1 is a node of the first and the second resistors R1 and R2. The first and the second resistors R1 and R2 may be coupled in series between a first ground node and an output terminal of the first comparator COM1.

The first resistor R1 may be a variable resistor. A resistance value of the first resistor R1 may be changed in response to the voltage control signals EN<2:0>. The first resistor R1 may be used as a trimming resistor.

The first and second resistors R1 and R2 may divide an output voltage of the first comparator COM1, and this divided output voltage may be outputted from node K1. A voltage REF applied to the first resistor R1 may be inputted to a non-inverting terminal (+) of the second comparator COM2. An inverting terminal (−) of the second comparator COM2 is coupled to a node K2.

The first, second and third PMOS transistors P1, P2 and P3 are coupled in series between a second ground node and an input terminal of the power source voltage VCCE. A node of the first PMOS transistor P1 and the second PMOS transistor P2 is the output terminal of the pump voltage VDC.

The output of the second comparator COM2 is inputted to the gate of the first PMOS transistor P1, the gate of the second PMOS transistor P2 is coupled to the node K2, and the gate of the third PMOS transistor P3 is coupled to the ground node. The node K2 is a node of the second PMOS transistor P2 and the third PMOS transistor P3.

As previously explained, the first resistor R1 may be changed in response to the voltage control signals EN<2:0>, and thus voltage of the node K1 may be changed. Accordingly, output voltage of the first comparator COM1 may be changed according to the voltage of the node K1. The voltage REF applied to the first resistor R1 may be changed according to the first resistor R1 and the output voltage of the first comparator COM1.

The second comparator COM2 makes a comparison between the voltage REF and the output voltage of the node K2 and outputs voltage according to a result of the comparison. The output voltage of the second comparator COM2 is inputted to a gate of the first PMOS transistor P1. Therefore, the pump voltage VDC is changed in accordance with the output voltage of the second comparator COM2. As an amount that the first PMOS transistor P1 is adjusted, or turned on/off, the amount of the pump voltage VDC may also be changed. According to the above operation, the pump voltage generator 250 outputs a level of the pump voltage VDC in response to the voltage control signals EN<2:0>.

The rising time of the output voltage Vpp is changed according to the level of the pump voltage VDC. When the rising time of the output voltage Vpp outputted from the voltage supply circuit 200 of FIG. 2b is controlled, each of the control signals and the output signal Vpp are supplied as explained in relation to FIG. 4.

Figure 4:
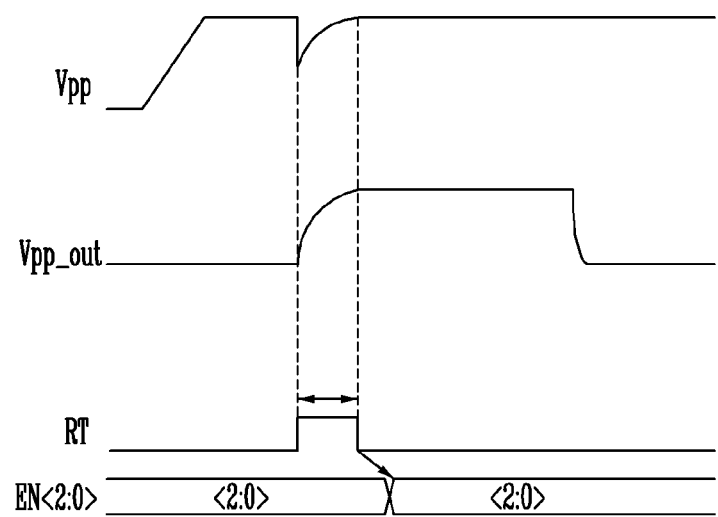
FIG. 4 is a timing diagram illustrating the operation of the voltage supply circuit of FIG. 2B.

FIG. 4 is a timing diagram illustrating the operation of the voltage supply circuit 200 of FIG. 2B. Referring to FIG. 4, when the control circuit 300 outputs the pump enable signal PUMP_EN in order to generate the output voltage Vpp, the pump group 210 starts a pumping operation. Accordingly, the output voltage Vpp starts rising.

The rising time detector 241 detects the rising time RT in response to the pump enable signal PUMP_EN and the voltage output signal V_OUT, and thus the voltage control signals EN<2:0> are outputted. The pump voltage VDC is changed in response to the voltage control signals EN<2:0>, and thus the rising time RT of the output voltage Vpp is also changed.

Through the above process, the voltage supply circuit 200 can provide the output voltage Vpp having the rising time RT which may be necessary for the internal circuit 400 to operate properly.

According to an embodiment of this disclosure, the rising time of voltage outputted from the voltage supply circuit can be easily changed. Accordingly, voltage optimized for an integrated circuit including the voltage supply device can be provided.

What is claimed is:

1. A voltage supply circuit, comprising:
   a clock generator for generating clocks swinging between an input voltage and a ground voltage in response to a system clock signal;
   a pump group for generating an operating voltage by pumping the input voltage in response to the clocks of the clock generator; and
   a pump voltage generator for generating the input voltage by changing a power source voltage to a desired level and changing a level of the input voltage according to a rising time of the operating voltage,
   wherein the rising time of the operating voltage is determined by a time when the pump group is enabled and a time when the operating voltage is inputted to a circuit using the operating voltage.

2. A voltage supply circuit, comprising:
   a pump voltage generator for generating a first voltage in response to voltage control information;
   a pump group for pumping voltage by using the first voltage and first and second clocks in response to a pump enable signal and supplying a pumped voltage to a driving circuit in response to an output control signal;
   a clock generator for generating the first and second clocks swinging between the first voltage and a ground voltage;
   a regulator for controlling an operation of the clock generator in order to regularly maintain an output voltage of the pump group; and
   a rising time controller for calculating a rising time of the pumped voltage by using the pump enable signal and the output control signal, and outputting the voltage control information according to the calculated rising time.

3. The voltage supply circuit of claim 2, wherein the voltage control information comprises first, second and third voltage control bits.

4. The voltage supply circuit of claim 3, wherein the pump voltage generator comprises:
   a first comparator configured to make a comparison between a reference voltage and a first feedback voltage and generate voltage according to a result of the comparison;
   first and second resistors configured to generate the first feedback voltage by dividing the voltage of the first comparator;
   a second comparator configured to make a comparison between voltage supplied to the first resistor and a second feedback voltage and generate voltage according to a result of the comparison;
   a first transistor coupled between a power source voltage and an output terminal of the first voltage, wherein a degree in which the first transistor is turned on is changed according to the voltage of the second comparator; and
   at least two diodes coupled between the first transistor and a ground node,
   wherein a resistance value of the first resistor is changed in response to the first, second and third voltage control bits, and the second feedback voltage is outputted from a node of the at least two diodes.

5. The voltage supply circuit of claim 3, wherein the rising time controller comprises:
   a rising time detector for detecting the rising time according to a time when the pump enable signal is enabled and a time when the output control signal is enabled;
   a digital converter for converting the rising time, detected by the rising time detector, into a digital value; and
   a data converter for outputting the digital value of the digital converter as the first, second and third voltage control bits.

6. The voltage supply circuit of claim 5, wherein the data converter stores the first, second and third voltage control bits in a data table form.

7. An integrated circuit, comprising:
a voltage supply circuit for supplying an operating voltage to an internal circuit; and
a control circuit for controlling operations of the voltage supply circuit and the internal circuit,
wherein the voltage supply circuit comprises:
a pump voltage generator for generating a first voltage in response to voltage control information;
a pump group for pumping voltage by using the first voltage and first and second clocks in response to a pump enable signal generated from the control circuit and supplying the pumped voltage as the operating voltage of the internal circuit in response to an output control signal generated from the control circuit;
a clock generator for generating the first and second clocks swinging between the first voltage and a ground voltage in response to a system clock signal;
a regulator for controlling an operation of the clock generator in order to regularly maintain an output voltage of the pump group; and
a rising time controller for calculating a rising time of the pumped voltage by using the pump enable signal and the output control signal and outputting voltage control information according to the calculated rising time.

8. The integrated circuit of claim 7, wherein the voltage control information comprises first, second and third voltage control bits.

9. The integrated circuit of claim 8, wherein the pump voltage generator comprises:
a first comparator configured to make a comparison between a reference voltage and a first feedback voltage and generate voltage according to a result of the comparison;
first and second resistors configured to generate the first feedback voltage by dividing the voltage of the first comparator;
a second comparator configured to make a comparison between voltage supplied to the first resistor and a second feedback voltage and generate voltage according to a result of the comparison;
a first transistor coupled between a power source voltage and an output terminal of the first voltage, wherein a degree in which the first transistor is turned on is changed according to the voltage of the second comparator; and
at least two diodes coupled between the first transistor and a ground node,
wherein a resistance value of the first resistor is changed in response to the first, second and third voltage control bits, and the second feedback voltage is outputted from a node of the at least two diodes.

10. The integrated circuit of claim 8, wherein the rising time controller comprises:
a rising time detector for detecting the rising time according to a time when the pump enable signal is enabled and a time when the output control signal is enabled;
a digital converter for converting the rising time, detected by the rising time detector, into a digital value; and
a data converter for outputting the digital value of the digital converter as the first, second and third voltage control bits.

11. The integrated circuit of claim 10, wherein the data converter stores the first, second and third voltage control bits in a data table form.

12. The integrated circuit of claim 7, wherein the internal circuit comprises a clock supply circuit for supplying the system clock signal to the clock generator.

13. The integrated circuit of claim 10, wherein the rising time detector detects a time when the pump enable signal is enabled and a time when the output control signal is enabled by using the system clock signal.

14. An integrated circuit, comprising:
a pump group for generating an operating voltage by pumping an input voltage in response to clocks swinging between the input voltage and a ground voltage;
a voltage transfer circuit for supplying the operating voltage of the pump group to an internal circuit in response to a voltage output signal; and
an input voltage generator for controlling a level of the input voltage according to a rising time of the operating voltage determined by a pump enable signal, the voltage output signal, and an input clock signal.

15. The integrated circuit of claim 14, wherein the pump group comprises:
pumps for pumping the input voltage in response to the clocks;
a regulator for generating a control signal to regularly maintain voltage outputted from the pumps; and
a clock generator for generating the clocks from the input clock signal in response to the control signal of the regulator.

16. The integrated circuit of claim 14, wherein the input voltage generator comprises:
a rising time detector for calculating the rising time of the operating voltage by using the pump enable signal, the voltage output signal, and the input clock signal;
a digital converter for converting the calculated rising time into a digital value;
a data converter for generating a voltage control signal corresponding to the converted digital value; and
a pump voltage generator for changing the level of the input voltage in response to the voltage control signal.

17. The integrated circuit of claim 16, wherein the pump voltage generator comprises:
a first comparator configured to make a comparison between a reference voltage and a first feedback voltage and generate voltage according to a result of the comparison;
first and second resistors configured to generate the first feedback voltage by dividing the voltage of the first comparator;
a second comparator configured to make a comparison between voltage supplied to the first resistor and a second feedback voltage and generate voltage according to a result of the comparison;
a first transistor coupled between a power source voltage and an output terminal of the first voltage, wherein a degree in which the first transistor is turned on is changed according to the voltage of the second comparator; and
at least two diodes coupled between the first transistor and a ground node,
wherein a resistance value of the first resistor is changed in response to the first, second and third voltage control bits, and the second feedback voltage is outputted from a node of the at least two diodes

* * * * *